US008415187B2

(12) United States Patent
Fritzemeier et al.

(10) Patent No.: US 8,415,187 B2
(45) Date of Patent: Apr. 9, 2013

(54) LARGE-GRAIN CRYSTALLINE THIN-FILM STRUCTURES AND DEVICES AND METHODS FOR FORMING THE SAME

(75) Inventors: Leslie G. Fritzemeier, Lexington, MA (US); Christopher J. Vineis, Watertown, MA (US)

(73) Assignee: Solexant Corporation, San Jose, CA (US)

(*) Notice: Subject to any disclaimer, the term of this patent is extended or adjusted under 35 U.S.C. 154(b) by 170 days.

(21) Appl. No.: 12/695,408

(22) Filed: Jan. 28, 2010

(65) Prior Publication Data

US 2010/0193795 A1    Aug. 5, 2010

Related U.S. Application Data

(60) Provisional application No. 61/147,879, filed on Jan. 28, 2009.

(51) Int. Cl.
*H01L 21/00* (2006.01)

(52) U.S. Cl.
USPC ............................... 438/46; 438/71; 438/486

(58) Field of Classification Search .......... 438/46, 438/71, 486
See application file for complete search history.

(56) References Cited

U.S. PATENT DOCUMENTS

| | | | |
|---|---|---|---|
| 3,372,069 A | 3/1968 | Bailey et al. | |
| 4,128,733 A | 12/1978 | Fraas et al. | |
| 4,165,558 A | 8/1979 | Armitage, Jr. et al. | |
| 4,227,942 A | 10/1980 | Hall | |
| 4,321,099 A | 3/1982 | Frosch et al. | |
| 4,332,974 A | 6/1982 | Fraas | |
| 4,392,297 A | 7/1983 | Little | |
| 4,400,244 A | 8/1983 | Kroger et al. | |
| 4,419,178 A | 12/1983 | Rode | |
| 4,498,183 A * | 2/1985 | Levatter ..................... | 372/86 |
| 4,514,583 A | 4/1985 | Izu et al. | |
| 4,530,739 A | 7/1985 | Hanak et al. | |
| 4,704,624 A | 11/1987 | Yamazaki et al. | |
| 4,707,216 A | 11/1987 | Morkoc et al. | |
| 4,774,194 A | 9/1988 | Hokuyou et al. | |
| 4,808,462 A | 2/1989 | Yaba et al. | |
| 4,981,525 A | 1/1991 | Kiyama et al. | |
| 5,136,351 A | 8/1992 | Inoue et al. | |
| 5,156,995 A | 10/1992 | Fitzgerald, Jr. et al. | |
| 5,231,047 A | 7/1993 | Ovshinsky et al. | |

(Continued)

FOREIGN PATENT DOCUMENTS

| | | |
|---|---|---|
| EP | 1109230 A2 | 6/2001 |
| EP | 1469528 A2 | 10/2004 |

(Continued)

OTHER PUBLICATIONS

International Search Report and Written Opinion, PCT/US2010/022381. Jun. 17, 2010, 18 pages.

(Continued)

*Primary Examiner* — Laura Menz
(74) *Attorney, Agent, or Firm* — Bingham McCutchen LLP

(57) ABSTRACT

Methods for forming semiconductor devices include providing a crystalline template having an initial grain size, annealing the crystalline template, the annealed template having a final grain size larger than the initial grain size, forming a buffer layer over the annealed template, and forming a semiconductor layer over the buffer layer.

23 Claims, 4 Drawing Sheets

U.S. PATENT DOCUMENTS

| | | | |
|---|---|---|---|
| 5,254,481 A | 10/1993 | Nishida et al. | |
| 5,279,679 A | 1/1994 | Murakami et al. | |
| 5,282,902 A | 2/1994 | Matsuyama | |
| 5,403,771 A | 4/1995 | Nishida et al. | |
| 5,433,169 A | 7/1995 | Nakamura et al. | |
| 5,484,664 A | 1/1996 | Kitahara et al. | |
| 5,538,903 A | 7/1996 | Aramoto et al. | |
| 5,575,862 A | 11/1996 | Nishida et al. | |
| 5,603,764 A | 2/1997 | Matsuda et al. | |
| 5,668,050 A | 9/1997 | Iwasaki et al. | |
| 5,677,236 A | 10/1997 | Saitoh et al. | |
| 5,690,736 A | 11/1997 | Tokunaga et al. | |
| 5,739,086 A | 4/1998 | Goyal et al. | |
| 5,824,566 A | 10/1998 | Sano et al. | |
| 5,843,811 A | 12/1998 | Singh et al. | |
| 5,853,497 A | 12/1998 | Lillington et al. | |
| 5,895,938 A | 4/1999 | Watanabe et al. | |
| 5,897,331 A | 4/1999 | Sopori | |
| 5,913,986 A | 6/1999 | Matsuyama et al. | |
| 6,022,832 A * | 2/2000 | Fritzemeier et al. | 505/461 |
| 6,027,564 A * | 2/2000 | Fritzemeier et al. | 117/89 |
| 6,063,996 A | 5/2000 | Takada et al. | |
| 6,080,928 A | 6/2000 | Nakagawa et al. | |
| 6,106,615 A * | 8/2000 | Goyal et al. | 117/84 |
| 6,121,541 A | 9/2000 | Arya | |
| 6,130,380 A | 10/2000 | Nakamura et al. | |
| 6,166,319 A | 12/2000 | Matsuyama et al. | |
| 6,180,870 B1 | 1/2001 | Sano et al. | |
| 6,184,456 B1 | 2/2001 | Matsuyama et al. | |
| 6,194,023 B1 | 2/2001 | Mitsuhashi et al. | |
| 6,277,714 B1 | 8/2001 | Fonash et al. | |
| 6,288,325 B1 | 9/2001 | Jansen et al. | |
| 6,331,208 B1 | 12/2001 | Nishida et al. | |
| 6,340,788 B1 | 1/2002 | King et al. | |
| 6,362,021 B2 | 3/2002 | Ford et al. | |
| 6,413,794 B1 | 7/2002 | Sano et al. | |
| 6,426,320 B1 * | 7/2002 | Fritzemeier et al. | 505/461 |
| 6,428,635 B1 * | 8/2002 | Fritzemeier et al. | 148/435 |
| 6,432,521 B1 | 8/2002 | Yagi et al. | |
| 6,482,668 B2 | 11/2002 | Okada et al. | |
| 6,525,264 B2 | 2/2003 | Ouchida et al. | |
| 6,541,695 B1 | 4/2003 | Mowles | |
| 6,548,751 B2 | 4/2003 | Sverdrup, Jr. et al. | |
| 6,562,702 B2 | 5/2003 | Yagi et al. | |
| 6,562,761 B1 * | 5/2003 | Fritzemeier et al. | 505/510 |
| 6,638,838 B1 | 10/2003 | Eisenbeiser et al. | |
| 6,645,313 B2 | 11/2003 | Goyal et al. | |
| 6,646,293 B2 | 11/2003 | Emrick et al. | |
| 6,673,646 B2 | 1/2004 | Droopad | |
| 6,730,410 B1 * | 5/2004 | Fritzemeier et al. | 428/469 |
| 6,750,394 B2 | 6/2004 | Yamamoto et al. | |
| 6,756,289 B1 | 6/2004 | Nakagawa et al. | |
| 6,765,151 B2 * | 7/2004 | Fritzemeier et al. | 174/125.1 |
| 6,765,240 B2 | 7/2004 | Tischler et al. | |
| 6,784,139 B1 * | 8/2004 | Sankar et al. | 505/237 |
| 6,797,313 B2 * | 9/2004 | Fritzemeier et al. | 427/62 |
| 6,809,066 B2 * | 10/2004 | Reade et al. | 505/411 |
| 6,815,605 B1 | 11/2004 | Abe et al. | |
| 6,828,507 B1 * | 12/2004 | Fritzemeier et al. | 174/125.1 |
| 6,869,863 B2 | 3/2005 | Nishida et al. | |
| 6,872,988 B1 | 3/2005 | Goyal | |
| 6,893,732 B1 * | 5/2005 | Fritzemeier et al. | 428/548 |
| 6,962,873 B1 | 11/2005 | Park | |
| 6,974,501 B1 * | 12/2005 | Zhang et al. | 117/84 |
| 7,038,238 B1 | 5/2006 | Yamazaki et al. | |
| 7,067,856 B2 | 6/2006 | Ramdani et al. | |
| 7,075,002 B1 | 7/2006 | Yamazaki et al. | |
| 7,087,113 B2 | 8/2006 | Goyal | |
| 7,115,811 B2 | 10/2006 | Ho et al. | |
| 7,122,733 B2 | 10/2006 | Narayanan et al. | |
| 7,183,229 B2 | 2/2007 | Yamanaka et al. | |
| 7,211,521 B2 | 5/2007 | Mauk | |
| 7,256,142 B2 | 8/2007 | Fitzgerald | |
| 7,279,632 B2 | 10/2007 | Nakajima et al. | |
| 7,288,332 B2 | 10/2007 | Findikoglu et al. | |
| 7,339,109 B2 | 3/2008 | Stan et al. | |
| 7,342,276 B2 | 3/2008 | Ooms et al. | |
| 7,348,259 B2 | 3/2008 | Cheng et al. | |
| 7,601,430 B2 | 10/2009 | Finkikoglu | |
| 7,666,290 B2 | 2/2010 | Kruger et al. | |
| 7,709,360 B2 * | 5/2010 | Van Gestel | 438/486 |
| 7,745,313 B2 * | 6/2010 | Wang et al. | 438/479 |
| 8,193,076 B2 * | 6/2012 | Moslehi et al. | 438/479 |
| 8,236,603 B1 | 8/2012 | Fritzemeier et al. | |
| 2002/0144838 A1 * | 10/2002 | Fritzemeier et al. | 174/125.1 |
| 2003/0013280 A1 | 1/2003 | Yamanaka | |
| 2003/0019519 A1 | 1/2003 | Toyama et al. | |
| 2003/0027409 A1 | 2/2003 | Ramdani et al. | |
| 2003/0127051 A1 * | 7/2003 | Fritzemeier et al. | 118/715 |
| 2003/0148066 A1 * | 8/2003 | Reade et al. | 428/141 |
| 2003/0188680 A1 | 10/2003 | Nakagawa et al. | |
| 2003/0207043 A1 * | 11/2003 | Fritzemeier et al. | 427/551 |
| 2003/0221718 A1 | 12/2003 | Kubo et al. | |
| 2003/0230338 A1 | 12/2003 | Menezes | |
| 2004/0245543 A1 | 12/2004 | Yoo | |
| 2004/0256624 A1 | 12/2004 | Sung | |
| 2005/0074915 A1 | 4/2005 | Tuttle et al. | |
| 2006/0021565 A1 | 2/2006 | Zahler et al. | |
| 2006/0033160 A1 | 2/2006 | Findikoglu et al. | |
| 2006/0049399 A1 | 3/2006 | Lei et al. | |
| 2006/0073978 A1 | 4/2006 | Chason et al. | |
| 2006/0108688 A1 * | 5/2006 | Richardson et al. | 257/756 |
| 2006/0115964 A1 | 6/2006 | Findikoglu et al. | |
| 2006/0185582 A1 | 8/2006 | Atwater et al. | |
| 2006/0208257 A1 | 9/2006 | Branz et al. | |
| 2006/0255341 A1 | 11/2006 | Pinnington et al. | |
| 2007/0044832 A1 * | 3/2007 | Fritzemeier | 136/252 |
| 2007/0051302 A1 | 3/2007 | Gosain et al. | |
| 2007/0163489 A1 | 7/2007 | Son et al. | |
| 2007/0181891 A1 | 8/2007 | Eisert et al. | |
| 2007/0197012 A1 | 8/2007 | Yang et al. | |
| 2007/0215905 A1 | 9/2007 | Kohiro et al. | |
| 2007/0235824 A1 | 10/2007 | Rakshit et al. | |
| 2007/0261733 A1 | 11/2007 | Hannour et al. | |
| 2007/0277873 A1 | 12/2007 | Cornfeld et al. | |
| 2007/0277874 A1 | 12/2007 | Dawson-Elli et al. | |
| 2008/0023710 A1 | 1/2008 | Park et al. | |
| 2008/0050887 A1 | 2/2008 | Chen et al. | |
| 2008/0138927 A1 * | 6/2008 | Headrick | 438/97 |
| 2008/0217622 A1 * | 9/2008 | Goyal | 257/64 |
| 2008/0230779 A1 | 9/2008 | Goyal | |
| 2008/0265255 A1 | 10/2008 | Goyal | |
| 2008/0268622 A1 * | 10/2008 | Van Gestel | 438/486 |
| 2009/0114274 A1 * | 5/2009 | Fritzemeier | 136/255 |
| 2009/0117679 A1 * | 5/2009 | Fritzemeier | 438/46 |
| 2010/0022074 A1 * | 1/2010 | Wang et al. | 438/479 |
| 2010/0102403 A1 * | 4/2010 | Celik-Butler et al. | 257/415 |
| 2010/0193795 A1 * | 8/2010 | Fritzemeier et al. | 257/64 |
| 2010/0270653 A1 * | 10/2010 | Leitz et al. | 257/618 |
| 2011/0021006 A1 * | 1/2011 | Moslehi et al. | 438/479 |
| 2011/0027937 A1 * | 2/2011 | Fritzemeier | 438/71 |
| 2012/0100546 A1 * | 4/2012 | Lowery et al. | 435/6.12 |
| 2012/0248455 A1 * | 10/2012 | Van Gestel | 257/75 |

FOREIGN PATENT DOCUMENTS

| | | |
|---|---|---|
| WO | WO-8505221 | 11/1985 |
| WO | WO-9009039 | 8/1990 |
| WO | WO-9103583 | 3/1991 |
| WO | WO-9722152 | 6/1997 |
| WO | WO-9809337 | 3/1998 |
| WO | WO-9848079 | 10/1998 |
| WO | WO-0016409 | 3/2000 |
| WO | WO-0157932 | 8/2001 |
| WO | WO-02089188 | 11/2002 |
| WO | WO-02091482 | 11/2002 |
| WO | WO-03058725 | 7/2003 |
| WO | WO-2004033769 A1 | 4/2004 |
| WO | WO-2004099472 A1 | 11/2004 |
| WO | WO-2005096395 A1 | 10/2005 |
| WO | WO-2005/104236 | 11/2005 |
| WO | WO-2006111804 A1 | 10/2006 |
| WO | WO 2007025062 A2 * | 3/2007 |
| WO | WO-2007117034 A1 | 10/2007 |
| WO | WO-2007121619 A1 | 11/2007 |
| WO | WO-2007134843 A2 | 11/2007 |

| WO | WO-2008023265 A1 | 2/2008 |
| WO | WO-2010/088366 | 8/2010 |
| WO | WO 2010088366 A1 * | 8/2010 |

OTHER PUBLICATIONS

R. W. Cahn and P. Haasen: "Physical Metallurgy", Jan. 1, 1996, Elsevier Science, Amsterdam, XP002584210, ISBN: 0444898751, p. 2482, 3 pages.

S. H. Huang et al, "Simultaneous interfavial misfit array formation and antiphase domain suppression on miscut silicon substrate," Applied Physics Letters American Institute of Physics USA LNKD, vol. 92, No. 7, Aug. 18, 2008, 3 pages.

International Search Report and Written Opinion for International Patent Application No. PCT/US2008/081984, mailed Apr. 28, 2010 (8 pages).

International Preliminary Report on Patentability for International Patent Application No. PCT/US2008/081984, dated May 4, 2010 (5 pages).

International Search Report and Written Opinion mailed on Dec. 7, 2010 for International Application No. PCT/US2010/032008 (16 pages).

Budal et al. "X-Ray Microdiffraction Study of Growth Modes and Crystallographic Tilts in Oxide Films on Metal Substrates," Nature Materials, vol. 2, pp. 487-492 (Jul. 2003).

Zhang et al., "Epitaxy of cubic boron nitride on (001)-oriented diamond," 2 Nature Materials, pp. 312-315 (May 2003).

International Preliminary Report on Patentability for International Patent Application No. PCT/US2006/033115, dated Feb. 26, 2008 (6 pages).

International Search Report and Written Opinion for International Patent Application No. PCT/US2006/033115, mailed Oct. 2, 2007 (8 pages).

Mauk et al., "Large-grain (>1-mm), recrystalized germanium films on alumina, fused silica, oxide-coated silicon substrate for II-V solar cell applications," J. Crystal Growth 250, pp. 50-56 (2003).

Ohmachi et al., "Zone-melting germanium film recrystalization with tungsten encapsulation," Applied Physics Letters 43(1), pp. 971-973 (Nov. 1983).

Wilt et al., "GaAs Photovoltaics on Polycrystalline Ge Substrates," Photovoltaic Energy Conversion, Conf. Record of the 2006 IEEE 4th World Conf., vol. 2, pp. 1891-1894 (May 2006).

Akazaki et al. "Single-crystal Growth of Nb Films onto Molecular Beam Epitaxy Grown (001)InAs", American Institute of Physics, Appl. Phys. Lett. 59 (16) pp. 2037-2039 (Oct. 1991).

Goyal et al. "Low Cost, Single Crystal-like Substrates for Practical, high Efficiency Solar Cells", The American Institute of Physics, First NREL Conference, pp. 377-394 (1997).

Jones et al. "The Morphology and Microstructure of Thin-Film GaAs on Mo Substrates", National Renewable Energy Laboratory (NREL) pp. 1-6.

* cited by examiner

LARGE-GRAIN CRYSTALLINE THIN-FILM STRUCTURES AND DEVICES AND METHODS FOR FORMING THE SAME

CROSS-REFERENCE TO RELATED APPLICATION

This application claims priority to and the benefit of, and incorporates herein by reference in its entirety, U.S. Provisional Patent Application No. 61/147,879, which was filed on Jan. 28, 2009.

TECHNICAL FIELD

In various embodiments, the present invention relates to thin-film structures and devices.

BACKGROUND

Both the alternative-energy and flat-panel display markets have a need for high-quality, flexible substrates on which to produce highly crystalline semiconductor thin films.

The current solar cell (i.e., photovoltaic) market relies on technology that has been essentially unchanged for decades. Over 90% of the market is served by crystalline silicon (Si), either single-crystal or polycrystalline, with average conversion efficiencies of 12-20%. The costs of crystalline Si devices are high due to high-cost production methods and high demand for the raw materials in competition with the semiconductor electronics industry. Si devices must also be quite thick to achieve these efficiencies, consuming significant quantities of material. The remaining 10% of the market is served largely by thin-film structures based on amorphous Si, CdTe, or copper-indium-gallium-selenide ("CIGS") that are cheaper to produce but have energy conversion efficiencies below 10%. Amorphous Si efficiencies also degrade with time.

Higher conversion efficiencies, over 30%, have been demonstrated for thin film multi-junction devices based on III-V semiconductors such as GaAs. However, their production costs are very high since these devices are most advantageously grown on single-crystal germanium (Ge) or GaAs wafers costing over $10,000 per square meter.

Emerging low-cost photovoltaic technologies include ribbon-grown Si, polymeric/organic films, and nanotechnology-based approaches. None of these new solutions fully addresses the market needs for increased production volume, increased efficiency, and lower cost per watt generated.

A useful substrate for the growth of high efficiency semiconductor films (e.g., III-V semiconductor films) preferably enables the growth of low-defect films (similar to those formed on single-crystal wafers) but at much lower cost and with higher area. Flexibility is a useful attribute. The substrate is also preferably chemically compatible with both the semiconductor material and with the semiconductor process environment. These demanding attributes restrict the number of materials that may effectively be used for this application.

The ability to produce polycrystalline metals with crystallographic orientation (e.g., "biaxial texture") approaching single-crystal quality in pure metals has been known since the 1940's. Practical applications of such texture control have included the production of aluminum sheet with textures that enhance the production of cans. Most commercial uses of sheet materials avoid texture, however, because the properties of sheet materials are more isotropic in its absence.

Face-centered cubic (fcc) metals, some body-centered cubic (bcc) metals, and some alloys based on fcc metals may be useful as substrate materials, as they may be biaxially textured using well-known rolling-deformation and annealing processes. A well-known texture in fcc metals and alloys is the "cube texture," in which the c-axis of each of the substrate grains is substantially perpendicular to the substrate surface, and the a-axes align primarily along a length direction. Under controlled rolling and annealing processes, these deformation-textured metals may possess biaxial texture approaching that of single crystals.

Nickel (Ni) is one fcc metal that may be made into thin foils with a well-defined cube texture using a rolling and annealing process. Prior work has shown that oxide intermediate layers may be deposited on a biaxially textured Ni surface using conditions under which nickel oxide is not stable, but where the intermediate layer (for example, $CeO_2$ or $Y_2O_3$) is stable, allowing the oxide to inherit the texture of the underlying Ni foil, i.e., form epitaxially thereon. The high-purity Ni required to achieve good biaxial texture is expensive and Ni is mechanically weak following the typical annealing heat treatment used to form the cube texture.

For these reasons, Ni alloys and other alloys have been developed to make stronger, non-magnetic biaxially textured foils. These alloys often contain alloying elements such as tungsten (W), molybdenum (Mo), vanadium (V), or chromium (Cr) in small controlled amounts. Relatively pure copper (Cu) may also be processed to produce a high-quality cube texture. Commercial grades of Cu with relatively low oxygen content and relatively low content of substitutional and interstitial elements have been of particular utility. In addition, prior work has shown that a wide range of Ni—Cu alloys may also be processed to produce high-quality cube textures.

Epitaxial films of other materials such as metals, oxides and nitrides can be grown on the biaxially textured foil. As used herein, "epitaxial" means that the crystallographic orientation of the deposited film is derived from and directly related to the crystallographic orientation of the underlying template.

Unfortunately, the existing deformation-textured foil approach is frequently not commercially viable for the deposition of semiconducting films necessary for high-performance optical and photovoltaic devices, e.g., Si, Ge, GaAs, InP, and related alloys and compounds. One promising approach utilizing Cu or Cu—Ni alloy textured foils is described in U.S. Patent Application Publication No. 2007/0044832A1, the entire disclosure of which is incorporated by reference herein. However, such foils may be incompatible with conventional semiconductor processes. Both Cu and Ni form arsenide and silicide phases when exposed to As- or Si-containing gases at typical processing temperatures above approximately 350° C. The formation of these phases causes a significant increase in volume, embrittles the foils, and renders the foils largely unusable for subsequent processing and for most applications.

One potential solution to the above-described problem appears in U.S. Patent Application Publication Nos. 2009/0117679 and 2009/0114274. Therein, a buffer layer inert to semiconductor precursors "inherits" the texture of the metal foil after formation thereon. The metal foil is then removed before formation of one or more semiconductor layers upon the buffer layer. While this approach addresses the semiconductor process incompatibility issue, the grain size and crystalline orientation of the buffer layer and semiconductor layer(s) are constrained to match those of the original textured metal foil. For many devices and applications, different (e.g., larger) grain size and/or texture are preferred. For example, compound semiconductor films such as GaAs are preferably formed on non-polar substrates (e.g., Ge) having a crystalline orientation tilted away ("off-axis") from a low-index crystallographic plane. When formed on such substrates, the compound semiconductor films advantageously contain no (or a few closely confined to the growth interface) anti-phase boundaries that may compromise the quality and efficiency of subsequently formed devices. In contrast, compound semiconductor films formed on non-polar substrates having a low-index crystallographic orientation ("on-axis"), e.g., (001) orientation, contain many deleterious anti-phase boundaries. Conventional methods utilizing cube-textured metal films are generally incapable of producing semiconductor films thereon having tilted crystallographic orientations; the cube texture represents a low-energy state for the growing films, and there is no driving force to form tilted orientations in such layers.

Thus, while considerable progress has been made in the use of biaxially textured foils in the production of inexpensive and/or flexible semiconductor thin films and devices, there is a need for processes and structures incorporating larger grain size and crystalline orientations different from the conventional cube texture.

SUMMARY

The foregoing limitations of conventional semiconductor thin-film platforms and fabrication processes are herein addressed by annealing, preferably in a single step, a polycrystalline template layer at a temperature sufficient to cause abnormal grain growth therein (i.e., at a temperature higher than the layer's secondary recrystallization temperature). The abnormal grain growth results in a textured layer with very large grains, although the texture is generally not cube-textured. Rather, the grains of the annealed layer tend to have a crystallographic orientation that is tilted away from a low-index plane. Buffer layers and/or semiconductor layers formed thereon have grain sizes larger than those achievable with conventional methods. Furthermore, the formation process, thickness, and/or post-formation processing of such subsequently formed layers may be optimized to achieve particular crystalline orientations not obtainable with conventional methods.

In an aspect, embodiments of the invention feature a method for forming a semiconductor device. A crystalline template having an initial grain size is provided. The crystalline template is annealed, the annealed template having a final grain size larger than the initial grain size. A buffer layer is formed over the annealed template, and a substrate layer is formed over the buffer layer. The annealed template is removed to expose a surface of the buffer layer, and a semiconductor layer is formed over the exposed surface of the buffer layer.

Before annealing the crystalline template may have an initial crystallographic orientation, and after annealing the annealed template may have a final crystallographic orientation different from the initial crystallographic orientation. The annealed template may have a final crystallographic orientation tilted away from (001) by a tilt angle, e.g., a tilt angle ranging from approximately 15° to approximately 20°. The semiconductor layer may have a crystallographic orientation approximately equal to the final crystallographic orientation of the annealed template, and/or a crystallographic orientation tilted away from (001) by an angle ranging from approximately 2° to approximately 8°, e.g., approximately 6°. The grain size of the annealed template may be greater than approximately 1 cm, and even greater than approximately 10 cm. The grain size of the annealed template may be greater than approximately ten times the thickness of the annealed template.

A semiconductor device, which may include or consist essentially of at least one polar compound semiconductor material, may be formed on the semiconductor layer. The semiconductor layer may include or consist essentially of a non-polar semiconductor material, and the semiconductor device may be substantially free of anti-phase boundaries. The buffer layer may include or consist essentially of Cr, Pd, Ir, an oxide, and/or a nitride. The crystalline template may include or consist essentially of Cu, Ni, and/or a Cu—Ni alloy.

In another aspect, embodiments of the invention feature a method for forming a semiconductor device. A crystalline template having an initial grain size is provided. The crystalline template is annealed, the annealed template having a final grain size larger than the initial grain size. A buffer layer is formed over the annealed template, and a semiconductor layer is formed over the buffer layer. The crystalline template includes or consists essentially of a material substantially impervious to reaction with As-containing gases and/or Si-containing gases at a temperature greater than approximately 350° C.

The crystalline template may include or consist essentially of steel. Before annealing the crystalline template may have an initial crystallographic orientation, and after annealing the annealed template may have a final crystallographic orientation different from the initial crystallographic orientation. The annealed template may have a final crystallographic orientation tilted away from (001) by a tilt angle, e.g., a tilt angle ranging from approximately 15° to approximately 20°. The semiconductor layer may have a crystallographic orientation approximately equal to the final crystallographic orientation of the annealed template, and/or a crystallographic orientation tilted away from (001) by an angle ranging from approximately 2° to approximately 8°, e.g., approximately 6°. The grain size of the annealed template may be greater than approximately 1 cm, and even greater than approximately 10 cm. The grain size of the annealed template may be greater than approximately ten times the thickness of the annealed template.

A semiconductor device, which may include or consist essentially of at least one polar compound semiconductor material, may be formed on the semiconductor layer. The semiconductor layer may include or consist essentially of a non-polar semiconductor material, and the semiconductor device may be substantially free of anti-phase boundaries. The buffer layer may include or consist essentially of Cr, Pd, Ir, an oxide, and/or a nitride. The crystalline template may include or consist essentially of Cu, Ni, and/or a Cu—Ni alloy.

In yet another aspect, embodiments of the invention feature a semiconductor structure including or consisting essentially of a substantially amorphous substrate layer, a tilted buffer layer disposed over the substrate layer, and a semiconductor layer disposed over the tilted buffer layer. The tilted buffer layer and/or the semiconductor layer has a grain size greater than approximately 1 cm.

The crystallographic orientation of the tilted buffer layer and/or the semiconductor layer may be tilted away from (001) by a tilt angle, e.g., a tilt angle ranging from approximately 15° to approximately 20°, ranging from approximately 2° to approximately 8°, or of approximately 6°. A semiconductor device, which may include or consist essentially of at least one polar compound semiconductor material, may be formed on the semiconductor layer. The semiconductor layer may include or consist essentially of a non-polar semiconductor material, and the semiconductor device may be substantially free of anti-phase boundaries. The magnitude of the tilt away from a low-index crystallographic direction of the semiconductor layer may be less than the magnitude of tilt away from the low-index crystallographic direction of the tilted buffer layer.

In a further aspect, embodiments of the invention feature a semiconductor structure including or consisting essentially of a template layer, a tilted buffer layer disposed over the template layer, and a semiconductor layer disposed over the tilted buffer layer. The template layer includes or consists essentially of a material substantially impervious to reaction with As-containing gases and/or Si-containing gases at a temperature greater than approximately 350° C.

The template layer, the tilted buffer layer, and/or the semiconductor layer may have a grain size greater than approximately 1 cm. The template layer may include or consist essentially of steel. The crystallographic orientation of the template layer, the tilted buffer layer, and/or the semiconductor layer may be tilted away from (001) by a tilt angle, e.g., a tilt angle ranging from approximately 15° to approximately 20°, ranging from approximately 2° to approximately 8°, or of approximately 6°. A semiconductor device, which may include or consist essentially of at least one polar compound semiconductor material, may be formed on the semiconductor layer. The semiconductor layer may include or consist essentially of a non-polar semiconductor material, and the semiconductor device may be substantially free of anti-phase boundaries. The template layer may be substantially tilted. The grain size of the template layer may be greater than approximately ten times the thickness of the template layer. The magnitude of the tilt away from a low-index crystallographic direction of the semiconductor layer may be less than the magnitude of tilt away from the low-index crystallographic direction of the tilted buffer layer.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
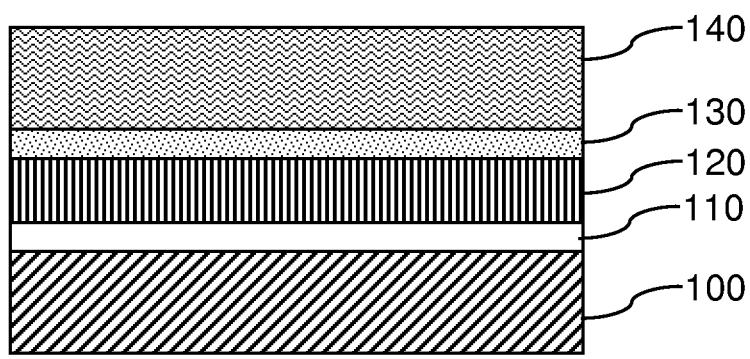
FIG. 1A is a schematic cross-sectional diagram of an exemplary structure formed on a crystalline template in accordance with various embodiments of the invention.

Templates suitable for use in embodiments of the present invention include crystallographically oriented material layers that are chemically compatible and are lattice-matched with known and anticipated semiconductor materials, in particular with compound semiconductors (e.g., III-V or II-VI semiconductor materials). "Lattice-matched," as used herein, refers to layers or materials having relative lattice spacings that allow the epitaxial growth of one layer (e.g., a buffer) on the other (e.g., a template) with a controlled crystallographic orientation and an acceptable level of defects to enable the subsequent integration of high-quality semiconductor materials and/or high-efficiency semiconductor devices. For metallic films, lattice-matching may be within an approximately 10% relative difference in lattice spacing, preferably within approximately 5%, and more preferably within approximately 2%. The lattice spacing may refer to the material's unit-cell lattice constant as it is commonly defined in the art, or to another interatomic spacing that can be defined in reference to the lattice constant. For instance, the lattice constant of a material may be lattice-matched to the lattice spacing defined by the diagonal of a face of a cubic crystal (which is approximately equal to 1.414 times the lattice constant). Furthermore, a material having a lattice constant (or other lattice spacing) that is approximately an integral multiple (again, within approximately 10%, approximately 5%, or approximately 2%) of that of another material may also be considered to be "lattice matched." For example, a material having a lattice spacing approximately twice that of a second material will achieve approximate lattice registry with every other atom of the second material. The necessary degree of matching may depend on the type of material under consideration. For example, a high-quality semiconductor layer may require closer lattice-matching to an underlying layer than a metal layer deposited on another metal layer. Non-limiting examples of lattice-matching include Cr and palladium (Pd), which are matched to within approximately 8%, as well as the cube-face diagonal of Cr and one-half the cube-face diagonal of Ge, which are matched to within approximately 3%.

Many of the materials described herein are preferably inexpensive, flexible, mechanically strong and/or compatible with a semiconductor processing environment. Generally, compatibility with a semiconductor processing environment includes resistance to degradation resulting from exposure to elevated temperatures and/or chemicals within the processing environment, including, e.g., resistance to hydrogen, arsenic, or silicon absorption.

"Chemically compatible", as used herein, refers to materials that do not react with or contaminate semiconductor layers to the extent that performance thereof is substantially affected. "Chemically compatible," as used herein, means that a material is not reactive with a semiconductor process environment and preferably is not reactive with and does not react with (at least at the processing temperatures contemplated herein) or contaminate a semiconductor material integrated thereon. Further, even if a reaction does occur, a chemically compatible material should not react with a semiconductor to the extent that it degrades the quality or performance of the semiconductor. As one non-limiting example of chemical compatibility, Ge and Cr may react to form a GeCr compound, but this compound is stable and does not affect the performance of either the Ge or other semiconductors formed atop the Ge.

As used herein, "tilted" refers to a layer having multiple grains that are textured but not crystallographically aligned along a low-index crystallographic direction, e.g., (111) or (100). (Thus, the above-described cube-textured layers are not tilted, as the grains thereof are substantially aligned with a (100) direction.) Rather, the grains are aligned at a non-zero angle (i.e., "tilted") with respect to a low-index crystallographic direction. Generally, grains in a tilted layer are tilted at approximately the same angle; however, the tilt may be toward one of several, e.g., two or even four, crystallographically equivalent directions. Thus, while the magnitude of a tilted layer is typically approximately equal in the grains of a tilted layer, the direction of the tilt may be different grain-to-grain. The magnitude of the tilt may be approximately constant throughout the thickness of the layer. In certain embodiments (further described below), the magnitude of the tilt may decrease as a function of thickness of the layer due to certain conditions, e.g., total layer thickness, growth rate of the layer, and/or the temperature of deposition. Herein, references to tilt and crystallographic orientation of polycrystalline layers are to at least one of the grains therein.

Referring to FIG. 1A, a polycrystalline template 100 is provided by, e.g., deformation rolling processes known in the art. Template 100 may be in the form of a thin foil, and may have a thickness between approximately 10 micrometers (μm) and approximately 100 μm, e.g., approximately 25 μm. A surface of template 100 may be polished, e.g., to mirror smoothness. Template 100 may include or consist essentially of a metal or a metal alloy, e.g., Cu, Ni, a Cu alloy, and/or a Ni alloy. Template 100 may include or consist essentially of a steel, e.g., an austenitic stainless steel. In its cold-rolled form, template 100 may have a grain size between approximately 100 nm and approximately 10 μm, e.g., approximately 1 μm. Template 100 may not be chemically compatible with semiconductor materials such as Ge, Si, and III-V semiconductors (e.g., template 100 may react with gases containing Ge, Si, and/or III-V semiconductor precursors such as As) at typical processing temperatures above approximately 350° C. In certain embodiments, template 100 includes or consists essentially of a material that reacts with As-containing gases and/or Si-containing gases at temperatures greater than approximately 350° C.

Template 100 is annealed at a temperature and/or time sufficient to cause abnormal grain growth therein. For example, template 100 may be annealed at a temperature between approximately 900° C. and approximately 950° C. in vacuum for a time between approximately 15 minutes and approximately 60 minutes. After annealing, template 100 exhibits large grain size, i.e., has one or more crystalline grains at least an order of magnitude (or even two orders of magnitude or more) larger than the pre-anneal grain size. For example, annealed template 100 may have one or more elongated grains approximately 1-10 cm wide and approximately 5-30 cm long (or even longer). Generally, the average size of grains of annealed template 100 is larger than approximately five times the thickness of template 100, or even larger than approximately ten times the thickness of template 100. Thus, the grain size of annealed template 100 is larger than that of a "cube-textured" metal film, as such films have average grain sizes generally limited to only one to five times their thickness. The large grain(s) of template 100 are typically tilted. For example, the large grains of annealed template 100 may each have a crystallographic orientation tilted approximately 15°-20° from a (001) orientation. In some embodiments, annealed template 100 includes only a single grain, i.e., is substantially single-crystalline. Preferably, the anneal is performed at a single step, without deliberate heating at an intermediate temperature. The anneal is also preferably performed without a seed (sometimes utilized to "select" a particular grain) proximate template 100. After annealing, template 100 is generally still polycrystalline and may still have large-angle grain boundaries separating its large grains. In some embodiments, annealed template 100 includes both tilted grains and cube-textured grains; generally, any cube-textured grains are smaller in size than the tilted grains.

The quality of annealed template 100 measured by x-ray diffraction is superior to that of conventional cube-textured metal layers. For example, the out-of-plane (002) rocking curve full-width half-maximum (FWHM) of a cube-textured metal film may typically be approximately 4-5°. Layers subsequently formed on such cube-textured layers also tend to have FWHM values of no less than approximately 4-5°. In contrast, the FWHM of annealed template 100 formed as described above may be less than approximately 1°, e.g., may range from approximately 0.1° to approximately 0.2°.

Optionally, a sacrificial layer 110 is formed over annealed template 100. Sacrificial layer 110 may include or consist essentially of a metal or a metal alloy, e.g., Pd, platinum (Pt), aluminum (Al), or silver (Ag), or may include or consist essentially of an element or compound enabling improved lattice matching between template 100 and buffer layer 120 (described below), e.g., a material having a lattice spacing therebetween. Sacrificial layer 110 may be formed by deposition, e.g., evaporation, sputtering, chemical vapor deposition, atomic layer deposition, molecular beam epitaxy, metallorganic deposition, or by electrochemical means such as electroplating (with or without electrodes). During formation, sacrificial layer 110 preferably inherits the crystallographic orientation (herein, the "crystallographic orientation" of a polycrystalline layer refers to the collective crystallographic orientations of the grains of the layer, each of which may be different from the others) and thus the tilt of annealed template 100. In some embodiments, the crystallographic orientation of sacrificial layer 110 initially replicates that of annealed template 100 but tilts back toward a low-index crystallographic orientation during formation; hence, the crystallographic orientation of sacrificial layer 110 may change in a tilt direction through at least a portion of its thickness. In such embodiments, the magnitude of the tilt at a top surface of sacrificial layer 110 may be less than the magnitude of the tilt at a top surface of annealed template 100. Further, the grain size of sacrificial layer 110 may be approximately equal to that of annealed template 100, e.g., greater than approximately 1 cm. Preferably, the grain size of sacrificial layer 110 is larger than that of unannealed template 100. In some embodiments, multiple sacrificial layers 110 may be formed over annealed template 100. Formation of sacrificial layer 110 may be performed without ion-beam assistance. During subsequent processing of annealed template 100, sacrificial layer 110 may substantially react with or diffuse into annealed template 100. Sacrificial layer 110 may have a thickness of, e.g., less than approximately 200 nm, e.g., less than approximately 100 nm, or even less than approximately 50 nm. In some embodiments, sacrificial layer(s) 110 have a thickness less than approximately 10 μm.

A buffer layer 120 is formed over annealed template 100 and optional sacrificial layer 110. Buffer layer 120 may include or consist essentially of a metal or a metal alloy, e.g., Cr and/or Ir, or may include or consist essentially of a nitride or an oxide. Such an oxide may be a compound consisting essentially of oxygen and at least one non-metallic element, e.g., Si. Buffer layer 120 may have a thickness of, e.g., between approximately 100 nm and approximately 500 nm, e.g., approximately 200 nm. In some embodiments, buffer layer 120 have a thickness less than approximately 10 μm. Buffer layer 120 may be formed by deposition, e.g., evaporation, sputtering, chemical vapor deposition, atomic layer deposition, molecular beam epitaxy, metallorganic deposition, or by electrochemical means such as electroplating (with or without electrodes). During formation, buffer layer 120 may inherit the crystallographic orientation (and thus the tilt) of annealed template 100 and/or sacrificial layer 110. In some embodiments, the crystallographic orientation of buffer layer 120 initially replicates that of annealed template 100 and/or sacrificial layer 110 but tilts back toward a low-index crystallographic orientation during formation; hence, the crystallographic orientation of buffer layer 120 may change in a tilt direction through at least a portion of its thickness. In embodiments in which the crystallographic orientation of sacrificial layer 110 tilts back toward a low-index crystallographic orientation, the crystallographic orientation of buffer layer 120 may further tilt toward the same low-index crystallographic orientation, i.e., the magnitude of the tilt at a top surface of buffer layer 120 may be less than the magnitude of the tilt at a top surface of annealed template 100 and/or sacrificial layer 110. Further, the grain size of buffer layer 120 may be approximately equal to that of annealed template 100, e.g., greater than approximately 1 cm. Preferably, the grain size of buffer layer 120 is larger than that of unannealed template 100. Buffer layer 120 may be provided without ion-beam assistance. In some embodiments, multiple buffer layers 120 may be formed over textured template 100.

Buffer layer 120 and/or sacrificial layer 110 may have an out-of-plane (002) rocking curve FWHM (as described above in relation to template 100) of less than approximately 1°, e.g., it may range from approximately 0.1° to approximately 0.2°. In preferred embodiments, the FWHM of buffer layer 120 and/or sacrificial layer 110 is approximately equal to that of annealed template 100.

An optional diffusion barrier 130 is formed over buffer layer 120. Diffusion barrier 130 may be formed substantially non-epitaxially and thus be substantially lacking the crystallographic orientation of buffer layer 120 and annealed template 100; diffusion barrier 130 may even be amorphous in some embodiments. Diffusion barrier 130 may include or consist essentially of a metal or a metal alloy, e.g., W or rhenium (Re), or may include or consist essentially of a nitride or an oxide, e.g., a compound consisting essentially of oxygen and at least one non-metallic element such as Si. Diffusion barrier 130 prevents substantially all interdiffusion or reaction between substrate layer 140 and semiconductor materials and devices formed over buffer layer 120 (as further described below).

In addition to or instead of diffusion barrier 130, an insulator layer (not shown), e.g., a dielectric or other electrical insulator, may be formed over buffer layer 120. The insulator layer may be amorphous, and may include or consist essentially of an oxide, e.g., a compound consisting essentially of oxygen and at least one non-metallic element such as Si. In an embodiment, the insulator layer may include or consist essentially of a nitride or aluminum oxide. The insulator layer may be formed by deposition, e.g., evaporation, sputtering, chemical vapor deposition, atomic layer deposition, or molecular beam epitaxy, and may be formed without ion-beam assistance. The insulator layer may provide electrical insulation between substrate layer 140 and subsequently formed semiconductor materials and devices (as further described below).

A substrate layer 140 is formed over buffer layer 120 and optional diffusion barrier 130 (and/or the insulator layer, if present). Substrate layer 140 provides structural support to semiconductor materials and devices formed over buffer layer 120 after removal of annealed template 100 (as further described below), and is preferably chemically compatible with semiconductor materials such as Ge, Si, and III-V semiconductors at typical processing temperatures above approximately 350° C. In a preferred embodiment, substrate layer 140 includes or consists essentially of a material substantially impervious to reaction with As-containing gases and/or Si-containing gases at temperatures greater than approximately 350° C. Substrate layer 140 may be formed substantially non-epitaxially and thus be substantially lacking the crystallographic orientation of buffer layer 120 and annealed template 100; substrate layer 140 may even be amorphous in some embodiments. Therefore, substrate layer 140 may be formed by any method known in the art, e.g., vacuum deposition, chemical vapor deposition, heat lamination, electrodeposition, slurry coating, metallorganic deposition, or lamination. In the case of lamination, the laminating agent such as, for example, a braze alloy or adhesive, should also be chemically compatible and thermally stable with any subsequent semiconductor processes. In an embodiment, substrate layer 140 is formed by electron-beam evaporation at a temperature greater than approximately 900° C. Substrate layer 140 may include or consist essentially of a composite, a ceramic (e.g., alumina and/or zirconia), a glass, a metal alloy, or a metal, e.g., a Fe—Ni—Co alloy (e.g., KOVAR™), W, Mo, and/or Al. In an embodiment, substrate layer 140 includes or consists essentially of a metal coated with a thicker ceramic material for additional structural support. In various embodiments, substrate layer 140 is flexible and thus capable of being manipulated into non-planar configurations. Substrate layer 140 may be substantially electrically conductive, enabling it to function as a contact, e.g., a back contact, for a subsequently formed semiconductor device. Substrate layer 140 may have a thickness of, e.g., between approximately 1 μm and approximately 0.5 mm.

Figure 1B:
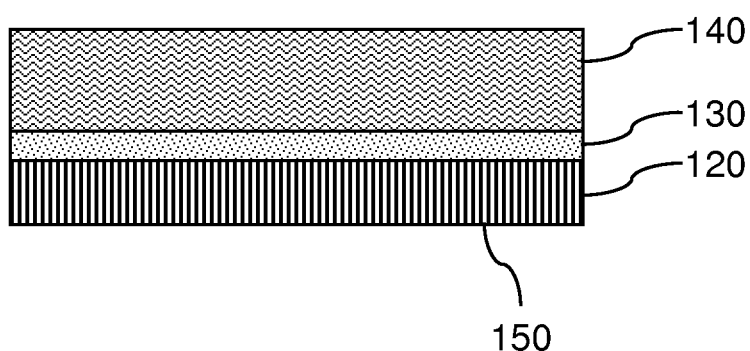
FIG. 1B is a schematic diagram of the structure of FIG. 1A after removal of the crystalline template.

Referring to FIG. 1B, annealed template 100 (and optional sacrificial layer 110, if present) is removed, exposing surface 150 of buffer layer 120. Annealed template 100 may be removed by a selective process and/or with end-point monitoring. As utilized herein, a selective process will remove substantially all of annealed template 100 without adversely affecting surface 150, thereby rendering surface 150 suitable for the subsequent formation of semiconductor materials and/or devices thereon. Suitable selective processes may include, e.g., chemical etching (with, e.g., an acid such as nitric acid), electrochemical etching, plasma etching, ion-beam bombardment, laser ablation, melting, and reverse-bias sputtering. Suitable end-point monitoring methods may include, e.g., surface reflectance, residual-gas analysis, optical-absorption spectroscopy, and other methods known in the art to be capable of detecting the substantially complete removal of annealed template 100. Optionally, the exposed surfaces of substrate layer 140 may be protected from damage or removal by a protective layer (not shown) during removal of annealed template 100. The crystallographic orientation and grain size of buffer layer 120 (derived from annealed template 100), and thus, surface 150, remains substantially unchanged after removal of annealed template 100.

Figure 2:
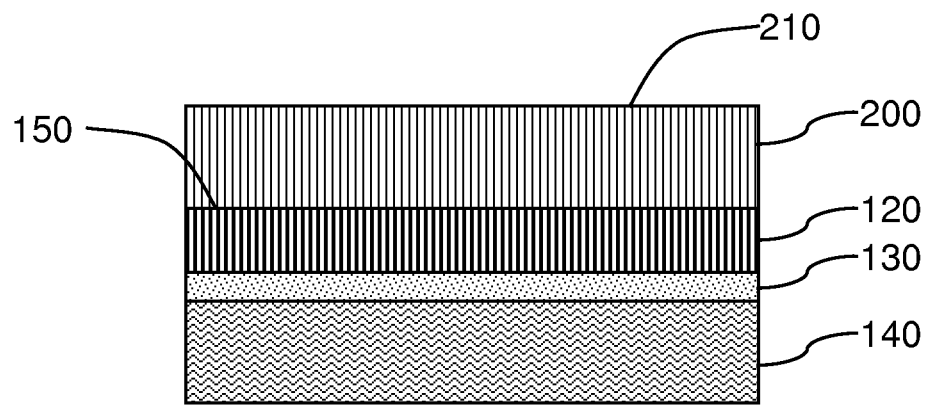
FIGS. 2-4 are schematic diagrams of the structure of FIG. 1B after further deposition and processing in accordance with various embodiments of the invention.

Referring to FIG. 2, at least one semiconductor layer 200 is formed over surface 150 of buffer layer 120. Buffer layer 120 and semiconductor layer 200 are preferably lattice-matched and chemically compatible. Semiconductor layer 200 may include or consist essentially of at least one group IV element or compound (e.g., Si, Ge, or SiGe), a III-V compound (e.g., a compound including a combination of Al, Ga, In, As, P, and/or N), or a compound such as PbTe, ZnTe, and/or an alloy or bilayer thereof, and may be doped (i.e., include n-type and/or p-type dopants). In a preferred embodiment, semiconductor layer 200 includes or consists essentially of at least one of Si, Ge, or InGaAs. Semiconductor layer 200 may initially inherit the crystallographic orientation (e.g., the tilt) of buffer layer 120 and may thus be substantially oriented away from a low-index crystallographic orientation, e.g., tilted between approximately 15° and 20° away from (001). The crystallographic orientation of semiconductor layer 200 may change as a function of thickness. For example, the orientation may tilt back toward a low-index crystallographic orientation, i.e., the magnitude of the tilt at a top surface of semiconductor layer 200 may be less than the magnitude of the tilt of buffer layer 120 (e.g., at surface 150). Thus, a top surface 210 of semiconductor layer 200 may be tilted away from (001) by between (and including) approximately 2° and approximately 8°, e.g., 6°. Preferably, all portions of semiconductor layer 200 (including top surface 210) have a non-zero tilt away from a low-index crystallographic orientation (e.g., the orientation of template 100 before annealing and abnormal grain growth. Semiconductor layer 200 may be formed by deposition, e.g., chemical vapor deposition, atomic layer deposition, molecular beam epitaxy, liquid phase epitaxy, or physical vapor deposition, at a deposition temperature between approximately 25° C. and approximately 700° C. The thickness of semiconductor layer 200 may be between approximately 100 nm and approximately 5 μm, e.g., approximately 2 μm. In an embodiment, semiconductor layer 200 is doped to form a p-n junction and/or a p-i-n junction therein. Such a junction may function as part of a subsequently fabricated semiconductor device (as described further below). Semiconductor layer 200 may include or consist essentially of at least one homojunction or of at least one heterojunction (incorporating multiple semiconductor materials, e.g., forming a quantum well of one material "sandwiched" between layers of another material).

Semiconductor layer 200 preferably has a grain size larger than that achievable with conventional methods (and larger than that of unannealed template 100), e.g., greater than approximately 1 cm. In an embodiment, the grain size of semiconductor layer 200 is approximately equal to the grain size of annealed template 100 and/or buffer layer 120. Semiconductor layer 200 preferably is free of anti-phase boundaries.

In a preferred embodiment, coefficients of thermal expansion of semiconductor layer 200 (and/or subsequently formed semiconductor materials and devices) and substrate layer 140 are substantially matched, thus enabling the fabrication of semiconductor materials and devices substantially free of deleterious residual stresses and/or cracks. According to various embodiments of the invention, substantially matched coefficients of thermal expansion have a relative difference of less than approximately 20%, preferably less than approximately 10-15%, and even more preferably less than approximately 5%. For example, a coefficient of thermal expansion of Mo is approximately $4.8 \times 10^{-6}/°$ C., matched to within approximately 15% of that of Ge or GaAs (approximately $5.7 \times 10^{-6}/°$ C.).

Figure 3:
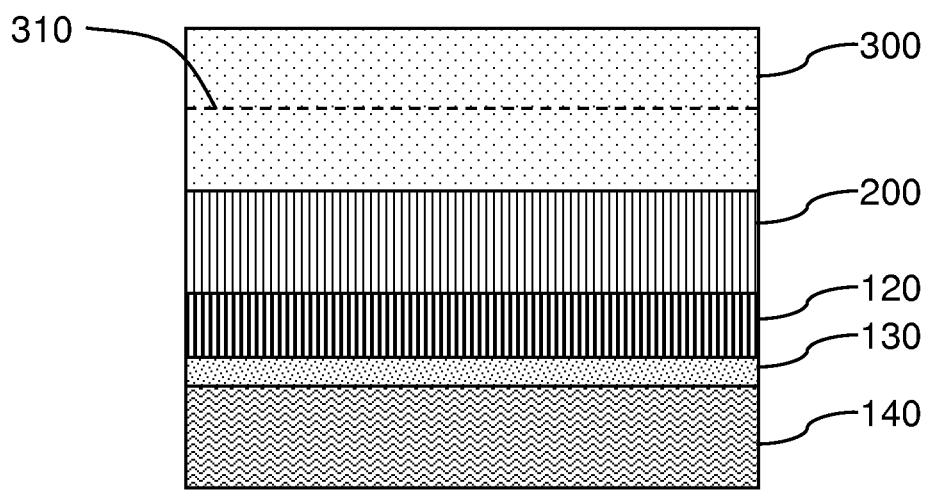

Referring to FIG. 3, in various embodiments of the invention, a semiconductor device 300 is formed over semiconductor layer 200. Semiconductor device 300 may include or consist essentially of a photovoltaic cell (see also, e.g., FIG. 4), a light-emitting diode, a laser, or backplane electronics to drive, e.g., a thin-film display. Semiconductor device 300 may include or consist essentially of a III-V compound (e.g., a compound including a combination of Al, Ga, In, As, P, and/or N), or a compound such as CdTe, CdS, ZnTe, MgTe and/or an alloy thereof, and may be doped (i.e., include n-type and/or p-type dopants). In an embodiment, semiconductor device 300 includes or consists essentially of at least one of GaAs, AlGaAs, InGaP, InGaAsN, InGaAsP, InP, AlInAs, InGaAs, CdTe, CdS, CdZnTe, or CdMgTe. Semiconductor device 300 may be doped to form at least one p-n junction and/or p-i-n junction. In FIG. 3, boundary 310 represents the approximate boundary between p- and n-type doped regions in a p-n junction or the intrinsic region in a p-i-n junction. Semiconductor device 300 may be lattice-matched to semiconductor layer 200, and may have a tilt substantially equal to that of semiconductor layer 200. Semiconductor device 300 may include or consist essentially of at least one homojunction or of at least one heterojunction.

In an embodiment, semiconductor device 300 includes or consists essentially of one or more polar compound-semiconductor materials, and semiconductor layer 200 includes or consists essentially of a non-polar semiconductor material such as Si, SiGe, or Ge. The non-zero crystallographic tilt of semiconductor layer 200 enables the formation of semiconductor device 300 containing substantially no anti-phase boundaries.

Figure 4:
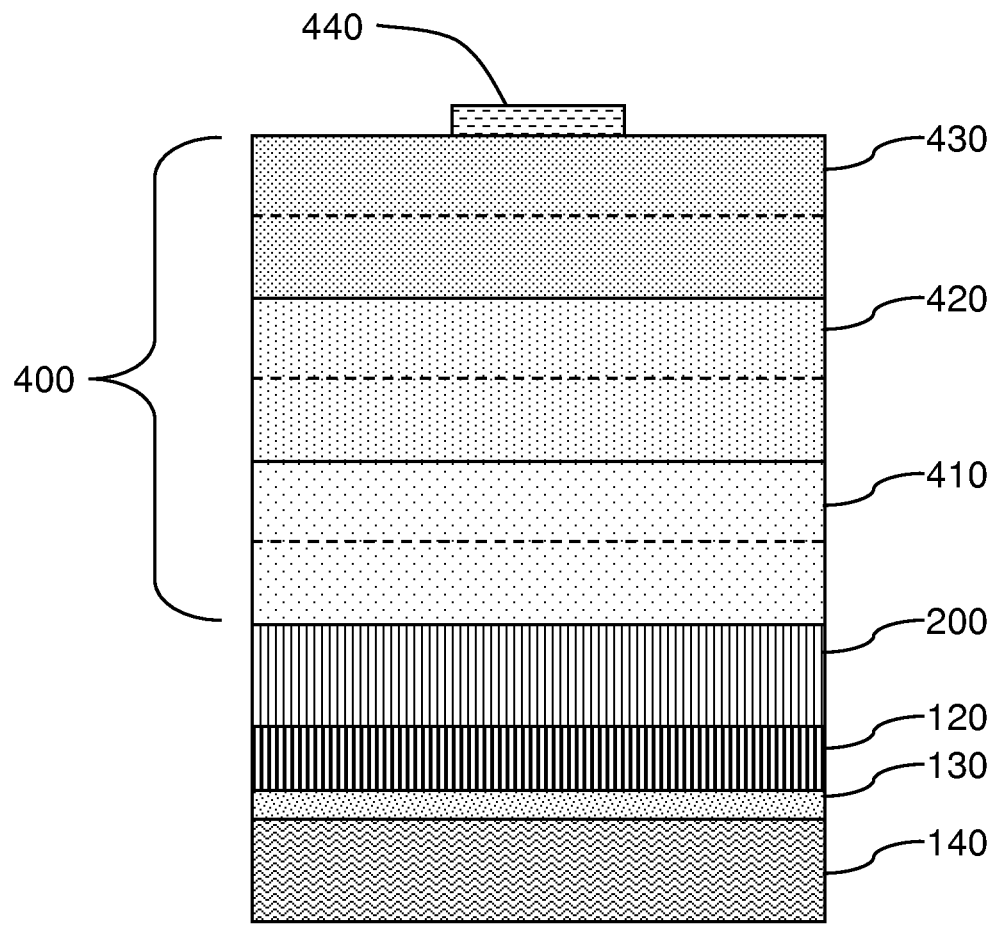

FIG. 4 illustrates a multijunction photovoltaic cell 400 formed over semiconductor layer 200. Cell 400 includes a plurality of p-n or p-i-n junctions; three such junctions 410, 420, 430 are depicted in FIG. 4. Each of the junctions may have a different bandgap; thus, each junction may absorb light of a different wavelength, increasing the overall efficiency of cell 400. The intrinsic layer in a p-i-n junction may decrease dark current of cell 400 (or a junction therein) by substantially preventing the formation of current leakage paths from the p-type doped layer to the n-type doped layer (or vice versa) along grain boundaries in one or more of the layers. The intrinsic layer may also substantially increase collection efficiency (i.e., the internal quantum efficiency) of photogenerated carriers by enabling transport by the faster drift process rather than by slower diffusion transport). One or more of the semiconductor materials in cell 400 may be substantially lattice-matched to semiconductor layer 200, and semiconductor layer 200 may include a p-n or p-i-n junction (and thus form an active portion of the device, as mentioned above). A top contact 440, which may include or consist essentially of, e.g., a metal or a transparent conductor (such as indium tin oxide), may be formed to enable electrical contact to cell 400. Substrate layer 140 may function as a back contact to cell 400. In structures containing an optional insulator layer over substrate layer 140, the insulator layer may provide isolation between multiple semiconductor devices 300 and/or cells 400 formed over a common substrate layer 140. Cell 400 (and/or other semiconductor devices 300) may exhibit energy conversion efficiencies greater than approximately 15%, greater than approximately 20%, or even greater than approximately 30% under one-sun terrestrial illumination conditions. The devices may exhibit greater than 80% of the energy conversion efficiencies of substantially similar devices fabricated over single-crystal semiconductor substrates.

Figure 5:
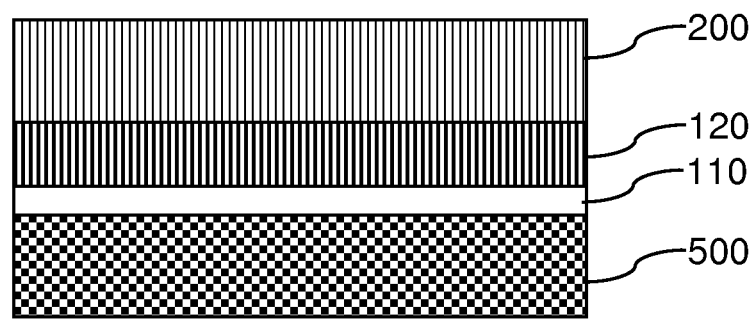
FIG. 5 is a schematic cross-sectional diagram of an exemplary structure formed on a crystalline template in accordance with additional embodiments of the invention.

Referring to FIG. 5, embodiments of the invention may be practiced utilizing a template 500 that is chemically compatible and thermally stable with subsequent semiconductor formation and processing. For example, template 500 may be chemically compatible with semiconductor materials such as Ge, Si, and III-V semiconductors at typical processing temperatures above approximately 350° C. In certain embodiments, template 500 includes or consists essentially of a material substantially impervious to reaction with As-containing gases and/or Si-containing gases at temperatures greater than approximately 350° C., such as steel (e.g., an austenitic stainless steel). Such templates 500 may be annealed and may have grain sizes and tilts as described above with respect to template 100. The utilization of such templates 500 enables the formation of semiconductor layer 200, semiconductor device 300, and/or cell 400 without the formation of substrate layer 140 and the removal of template 500. In such embodiments, semiconductor layer 200 is formed on buffer layer 120 while template 500 is present. Semiconductor device 300 and/or cell 400 (not shown in FIG. 5) may be formed on semiconductor layer 200 as described above.

The layer and/or device fabrication processes described herein may be practiced in a conventional batch or single-wafer process or by a roll-to-roll continuous or stepwise manufacturing method. The resulting devices may have surface areas greater than approximately 115 cm². Roll-to-roll processes may take place in a continuous system in which each step of the process is performed, or in a series of systems, each of which performing one or more of the steps in the process. A roll-to-roll process (or processes) may include or consist essentially of deposition of sacrificial layer 110, buffer layer 120, diffusion layer 130, and one or more semiconductor layers 200. A roll-to-roll process may also include the removal of template 100. Moreover, devices and materials utilized in accordance with embodiments of the present invention may be substantially non-superconducting.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for forming a semiconductor device, the method comprising:
   providing a cube-textured crystalline template having an initial grain size;
   annealing the crystalline template at a temperature above a secondary recrystallization temperature of the crystalline template, the annealed template having a final grain size larger than the initial grain size and comprising one or more grains that are tilted away from (001) by a tilt angle ranging from approximately 15° to approximately 20°;
   forming a buffer layer over the annealed template;
   forming a substrate layer over the buffer layer;
   removing the annealed template to expose a surface of the buffer layer; and
   forming a semiconductor layer over the exposed surface of the buffer layer.

2. The method of claim 1, wherein, before annealing, the crystalline template has an initial crystallographic orientation, and after annealing the annealed template has a final crystallographic orientation different from the initial crystallographic orientation.

3. A method for forming a semiconductor device, the method comprising:
   providing a crystalline template having an initial grain size;
   annealing the crystalline template, the annealed template having a final grain size larger than the initial grain size and a final crystallographic orientation tilted away from (001) by a tilt angle ranging from approximately 15° to approximately 20°;
   forming a buffer layer over the annealed template;
   forming a substrate layer over the buffer layer;
   removing the annealed template to expose a surface of the buffer layer; and
   forming a semiconductor layer over the exposed surface of the buffer layer,
   wherein the semiconductor layer has a crystallographic orientation tilted away from (001) by an angle ranging from approximately 2° to approximately 8°.

4. The method of claim 1, wherein a grain size of the annealed template is greater than approximately 1 cm.

5. The method of claim 1, further comprising forming a semiconductor device on the semiconductor layer.

6. The method of claim 5, wherein the semiconductor device comprises at least one polar compound semiconductor material.

7. The method of claim 6, wherein the semiconductor layer comprises at least one non-polar semiconductor material, and the semiconductor device is substantially free of anti-phase boundaries.

8. The method of claim 1, wherein the buffer layer comprises at least one of Cr, Pd, Ir, an oxide, or a nitride.

9. The method of claim 1, wherein the crystalline template comprises at least one of Cu, Ni, or a Cu-Ni alloy.

10. The method of claim 3, wherein the crystalline template is cube-textured prior to annealing.

11. The method of claim 3, wherein the crystalline template is annealed at a temperature above a secondary recrystallization temperature of the crystalline template, and the annealed template comprises one or more grains that are not cube-textured.

12. The method of claim 3, wherein a grain size of the annealed template is greater than approximately 1 cm.

13. The method of claim 3, further comprising forming a semiconductor device on the semiconductor layer.

14. The method of claim 13, wherein the semiconductor device comprises at least one polar compound semiconductor material.

15. The method of claim 14, wherein the semiconductor layer comprises at least one non-polar semiconductor material, and the semiconductor device is substantially free of anti-phase boundaries.

16. The method of claim 3, wherein the buffer layer comprises at least one of Cr, Pd, Ir, an oxide, or a nitride.

17. The method of claim 3, wherein the crystalline template comprises at least one of Cu, Ni, or a Cu-Ni alloy.

18. The method of claim 3, wherein the annealed template comprises only a single grain.

19. The method of claim 3, wherein a grain size of the annealed template is greater than approximately 10 cm.

20. The method of claim 3, wherein a grain size of the annealed template is greater than approximately ten times a thickness of the annealed template.

21. The method of claim 1, wherein the annealed template comprises only a single grain.

22. The method of claim 1, wherein a grain size of the annealed template is greater than approximately 10 cm.

23. The method of claim 1, wherein a grain size of the annealed template is greater than approximately ten times a thickness of the annealed template.

* * * * *